United States Patent
Totolos, Jr. et al.

(10) Patent No.: US 7,821,864 B2
(45) Date of Patent: Oct. 26, 2010

(54) POWER MANAGEMENT OF MEMORY VIA WAKE/SLEEP CYCLES

(75) Inventors: George Totolos, Jr., Cranberry Township, PA (US); Scott M. Westbrook, Los Altos, CA (US)

(73) Assignee: Network Appliance, Inc., Sunnyvale, CA (US)

( * ) Notice: Subject to any disclaimer, the term of this patent is extended or adjusted under 35 U.S.C. 154(b) by 883 days.

(21) Appl. No.: 11/691,321

(22) Filed: Mar. 26, 2007

(65) Prior Publication Data

US 2008/0043562 A1   Feb. 21, 2008

Related U.S. Application Data

(62) Division of application No. 11/118,505, filed on Apr. 28, 2005, now Pat. No. 7,218,566.

(51) Int. Cl.
*G11C 5/14* (2006.01)
(52) U.S. Cl. .......................... 365/227; 365/51; 365/226; 365/233.13
(58) Field of Classification Search .................. 365/51, 365/226, 227, 228, 233.13, 52
See application file for complete search history.

(56) References Cited

U.S. PATENT DOCUMENTS 6,065,124 A * 5/2000 Lee ............................. 713/323
6,118,719 A * 9/2000 Dell et al. ..................... 365/222
6,571,333 B1 5/2003 Jain et al.
6,618,791 B1 9/2003 Dodd et al.
6,781,911 B2 8/2004 Riesenman et al.
6,961,821 B2 11/2005 Robinson
7,069,409 B2 6/2006 Kim
7,155,623 B2 12/2006 Lefurgy et al.
2002/0083288 A1 6/2002 Kim
2004/0078524 A1 4/2004 Robinson
2004/0260957 A1 12/2004 Jeddeloh et al.
2005/0125702 A1 6/2005 Huang et al.
2005/0125703 A1 6/2005 Lefurgy et al.
2006/0020765 A1 1/2006 Mahrla et al.
2006/0164904 A1 7/2006 Saleh

* cited by examiner

*Primary Examiner*—Van Thu Nguyen
*Assistant Examiner*—Alexander Sofocleous
(74) *Attorney, Agent, or Firm*—Blakely, Sokoloff, Taylor & Zafman LLP

(57) ABSTRACT

A method of managing power states of memory modules while performing memory access operations is disclosed. Memory modules are in a power saving state until an access operation involving the module is to be performed. The module is placed in an operational mode, then the access operation is performed, then the module is returned to the power saving state. Apparatus and systems using the method are also disclosed and claimed.

11 Claims, 5 Drawing Sheets

POWER MANAGEMENT OF MEMORY VIA WAKE/SLEEP CYCLES

CLAIM OF PRIORITY

This application is a divisional of U.S. patent application Ser. No. 11/118,505 by George Totolos and Scott M. Westbrook, filed 28 Apr. 2005, and allowed on 23 Feb. 2007 as U.S. Pat. No. 7,218,566, and claims priority thereto.

FIELD OF THE INVENTION

At least one embodiment of the present invention pertains to a method of managing computer memory to reduce its power consumption, and more particularly, to reducing the power consumption of a computer memory while minimizing adverse performance effects.

BACKGROUND

Computer processors and other devices (often operating under the control of a processor) frequently need to store or retrieve information in a computer memory. Memories usually permit access to any portion of the information they contain within an essentially constant amount of time. This property is indicated by the words "random access" in the name commonly applied to a type of computer memory, "random access memory" ("RAM"). Other types of memory also permit random access, though their names may indicate other important properties of the memory. For example, read-only memory ("ROM"), including electrically-erasable, programmable read-only memory ("EEPROM" or "Flash") can also be accessed randomly. Random access storage contrasts with sequential access storage media, where access to one portion of the stored information may take significantly longer than access to another portion. For example, if information is stored on a magnetic tape, then retrieving information at the end of the tape may take much longer than retrieving information at the beginning.

Random access capability is often critical to adequate performance of applications on a general- or special-purpose computer. However, in some circumstances, memory access patterns may be perfectly predictable, or may be sufficiently regular that even a significant time penalty to begin accessing data can be tolerated by amortizing that penalty over a large number of operations. Also, in some applications, it may be known that the processor will never need to access only a single byte within a block of memory, but will only need to move the entire block from one place to another. In these and other similar situations, memory need not provide random access capabilities.

Whether computer memory is accessed randomly or sequentially, and as individual bytes or as larger blocks, its storage and retrieval functions are typically performed by electronic integrated circuits. The circuits are often packaged in a form known as a dual in-line memory module, or "DIMM." This term will be used herein, but it should be recognized that the discussion applies equally to any memory device having the characteristics described, and not only to memories in the specific DIMM package.

DIMMs require electrical power to perform their storage and retrieval functions. The amount of power consumed (luring operation is generally proportional to factors such as the amount of storage provided and the speed of operation. For example, one 2 GB DIMM available on the market requires a current of 1.71 A at 1.8V (3.08 W) when storing or retrieving data. When not operating, but capable of responding immediately to a read or write command, the memory consumes 2.26 W. Other memory modules may consume different amounts of power.

Standard dynamic RAM ("DRAM") devices available today (including synchronous DRAM, "SDRAM;" double data rate, "DDR" or "DDR1;" and double (data rate version 2, "DDR2" (devices) generally have a low power mode defined by the JEDEC Solid State Technology Association (formerly Joint Electron Device Engineering Council). This mode is called "self-refresh," and is typically used by portable (devices such as laptops when they are put into a "sleep" state for the sake of battery conservation. In self-refresh mode, the aforementioned 2 GB DIMM requires just 180 ma (324 mW), a power savings of almost 90%. Other memory modules may achieve greater or lesser power savings in self-refresh mode. A (dynamic memory in self-refresh mode is (different from a non-volatile memory such as EEPROM or Flash that can retain its contents even when power is completely removed. A DRAM in self-refresh mode continues to consume a small amount of power, and will lose its contents if power is interrupted.

Of course, the power savings offered by self-refresh mode come at a price. New information cannot be written to, and existing (data cannot be retrieved from, a DIMM in self-refresh mode. If these functions of the memory are required, the "sleeping" memory must be "awoken:" it must go through a power-up procedure that may take many clock cycles, or that may restrict the memory to a lower-speed operational mode in lieu of those clock cycles. The time-consuming power-up procedure is necessary to permit the memory to synchronize its internal operations with an external clock by means of a (delay-locked loop ("DLL"). In some systems, the synchronization may take significantly longer than the normal memory access time of only a few clock cycles, possibly exceeding the access time by a factor of 10 or more. Alternatively, some memories can be powered up and ready for operation within a few cycles (without performing synchronization), but in that event, access cycles may be limited to only a fraction of the full speed possible if the synchronization is performed.

In either case, switching DIMMs into and out of self-refresh mode to save power is not a promising strategy when the system's memory access patterns are not predictable, because the power-up time or performance penalties may be incurred whenever a DIMM containing required information is in low-power mode.

Although these discussions of DIMM power management operations have referred specifically to DIMMs that conform to the JEDEC DDR1 and DDR2 standards, it is expected that future versions of these standards (e.g. DDR3, DDR4, and so forth) will maintain similar power management capabilities and time or performance penalties for using them. Thus, the subsequent discussions will remain applicable to future DIMMs that implement descendants of DDR1 and DDR2. Also, other (non-JEDEC) memory modules may offer a "sleep" mode wherein the memory retains its contents, but cannot perform any of its other functions until a "wake" procedure is performed. The sleep mode will typically be associated with reduced power consumption, and the wake procedure will often impose a time or performance penalty. The subsequent discussions are relevant to this sort of memory module as well.

SUMMARY OF THE INVENTION

Embodiments of the invention manage power to a plurality of memory modules, where each module has at least a lowand a high-power state. A set of memory access requests is maintained, each request specifying a transfer of data to or from one of the memory modules. A request from the set is selected, and the memory module that is involved in the request is changed from low-power state to high-power state. Then the request is executed, and the memory module is returned to its low-power state.

BRIEF DESCRIPTION OF DRAWINGS

Embodiments of the invention are illustrated by way of example and not by way of limitation in the accompanying figures. In those figures, like reference numbers indicate similar elements.

DETAILED DESCRIPTION

Consider an application in which a large amount of memory is required to fulfill a product need. If the application's memory access patterns are predictable, rather than random, then it may be possible to operate the large amount of memory according to an embodiment of the invention and either dramatically reduce the power consumed by the memory, or dramatically increase the amount of memory that can be operated within a fixed power budget. A specific application with appropriate memory access patterns will be described first, then the concepts will be generalized to assist in identifying other applications that can benefit from the invention. Finally, extensions and alternate embodiments will be discussed.

Embodiments of the invention manage the power supplied to the DIMMs that comprise a computer memory. When the memory is idle (i.e., when the system is not currently engaged in transferring data to or from the memory), all DIMMs that are managed are placed in a low power (or power saving) state such as "self-refresh" or "sleep" mode. When a request to transfer data to or from a DIMM in the memory occurs, that DIMM is powered up ("woken") so that the request can be serviced. After the transfer is finished, the DIMM is returned to the low power state.

Of course, no single limit can be identified, beyond which a memory is "large," and less than which it is "small." Instead, a memory may be considered "large" by reference to other parameters of the system of which the memory is a part. For example, a memory that would normally consume more power than the system can provide might be considered "large." Embodiments of the invention may be useful in any system where there are multiple DIMMs (or other types of memory modules) in use, and reducing the amount of power used by those DIMMs provides an overall system benefit.

Note that the expressions "low power" and "high power" as used herein are different from the terms "low" and "high" that are sometimes used in describing the states of a binary circuit. Here, the expressions refer to the overall amount of electrical power consumed by a memory module. This amount of power is generally only weakly related to the data stored in the module. In other words, a memory containing all zeros (or logical "low" states) generally will not consume a significantly different amount of power than a similar memory containing all ones (or logical "high" states).

Figure 1:
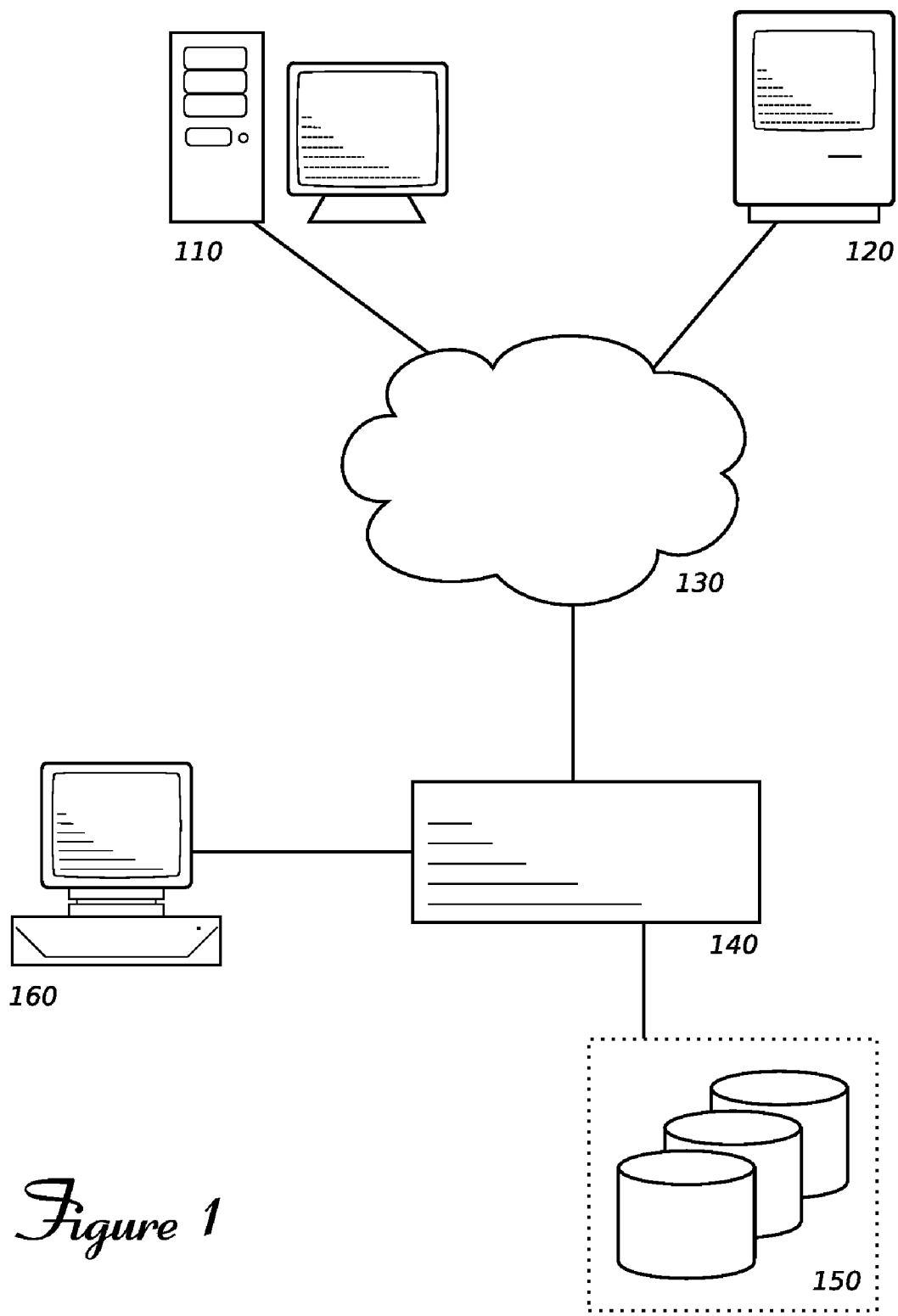
FIG. 1 shows an environment including a server that can benefit from embodiments of the invention.

FIG. 1 shows a network environment containing computers 110 and 120, which act as clients of server 140. The clients communicate with the server through a medium such as network 130. Computer system 160 may be useful to configure, monitor, or manage server 140. The server may control a number of mass storage devices such as disks 150.

Server 140 may provide data storage services to its clients. For example, server 140 may have extensive storage resources, protected by data redundancy, backup, and power reliability measures. Data storage services may be provided on a per-file basis, where server 140 appears as to its clients as a network file server, or on a per-block basis, where server 140 appears to the clients as a directly-attached disk drive. In either situation, server 140 may need to move large quantities of data about, both internally and between its clients and its mass storage devices. Furthermore, server 140 may not need to examine or modify individual bits or bytes, but may simply be required to accept or deliver blocks consisting of, for example, 1,024 (1K) bytes, 4,096 (4K) bytes, or other numbers of bytes of user data.

Figure 2:
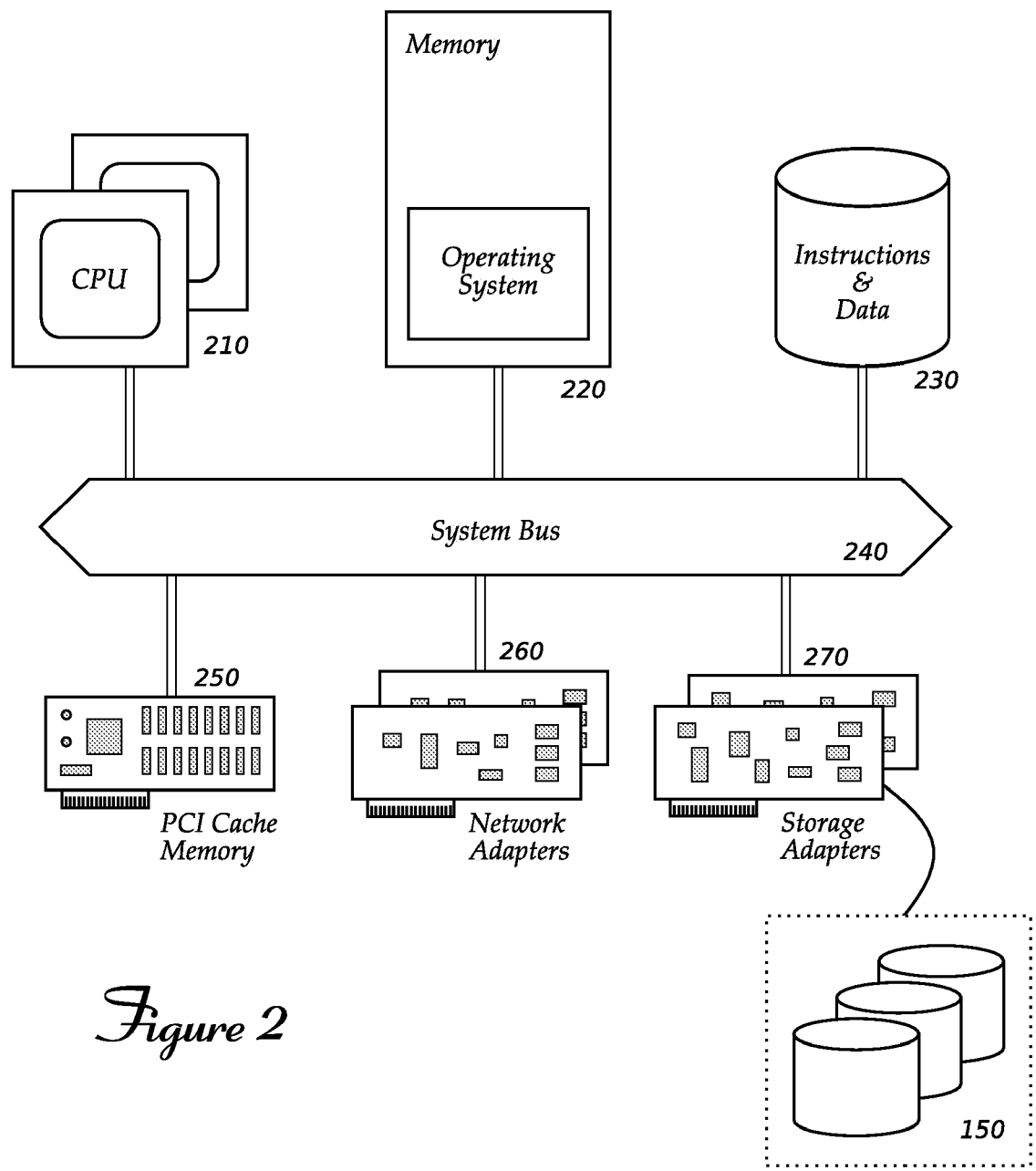
FIG. 2 is a block diagram of the server of FIG. 1, showing the components that may be found in such a server.

This storage server application may be implemented by a computer system such as that depicted in functional-block form in FIG. 2. Central processing units (CPUs) 210 may control and coordinate the operation of various devices connected to system bus 240, under the direction of instructions stored in memory 220. Disk 230 may contain other instructions and data that are not immediately required by the system in its operations. The system can communicate with its clients through network adapters 260, and with its mass storage devices such as disks 150 through storage adapters 270. The system may also benefit from additional cache memory, separate from memory 220, that may be installed on an add-in card such as PCI cache memory card 250.

In operation, the storage server may place user data on mass storage devices 150 for long-term availability, but to improve performance and throughput, it may be beneficial to store, or "cache," copies of the user data in memory 220. Eventually, memory 220 may become full of these cached copies of user data, and a least-recently-used ("LRU") or similar algorithm may be employed to determine which cached data to remove when it is desired to store copies of new data. Blocks of data selected for removal are called "victims," and would normally be discarded from memory 220 to make room for the new data. (The discarded victim data can, of course, be read in again from mass storage devices 150 if necessary. The memory caching described here only affects system performance, not data integrity.)

Improved system performance may be possible if, instead of simply discarding cache victim data blocks, they are copied to a secondary cache such as PCI cache memory 250. The secondary cache permits more user data to be stored for ready access-data in PCI cache memory 250 may be located and copied into memory 220 for further processing by CPUs 210 much faster than the same data could be located and transferred from mass storage devices 150.

To transfer data to and from PCI cache memory 250, direct memory access ("DMA") operations may be most efficient. In a DMA transfer, a CPU may configure a special-purpose circuit with source and destination addresses and other information, and then the circuit automatically generates addresses and performs consecutive memory cycles to move data from one place to another. Note that the memory access patterns resulting from a DMA transfer are predictable given knowledge of the information with which the special-purpose circuit is configured. Furthermore, in the specific example of a storage server being considered here, many DMA transfers will move blocks of data consisting of, for example, 4K bytes.

If the source or destination of a DMA transfer is a bank of memory operated according to an embodiment of the invention, the memory will include a number of DIMMs (or equivalent memory devices in other packages, where each device has a power saving state) that are initially in a low-power mode. When one or more DMA transfers are required, circuitry such as a memory controller associated with the memory may perform operations according to the flowchart of FIG. 3, which describes one embodiment of the invention.

The flowchart shows three processes that can be performed mostly concurrently by hardware, firmware, or software entities operating largely independently. When the memory controller is idle, all processes are inactive, no data are being transferred between the memory bank and the host system, and all of the DIMMs may be in a sleep state.

Process 310, DMA descriptor prefetch, is concerned with receiving or obtaining DMA requests from the host system and providing the requests to the other processes. When a DMA request arrives (315), it is stored or queued (320), and memory control process 330 may be notified that there is work to do (325).

When the DMA descriptor prefetch 310 has one or more DMA requests to service, memory control process 330 selects a DMA descriptor (335) and identifies the DIMM to (or from) which data are to be transferred (340). If the identified DIMM is not currently active (345), the memory control process 330 will start the power-up procedure (350) and there may be a delay (355) while the DIMM becomes ready. Once the DIMM has reached its normal or operational power state and is ready to transfer data, the DMA request can be issued to the DMA engine 370 for execution (360).

When a DMA request is pending and the source or destination DIMM is ready, DMA engine 370 can accept the request (375) and begin transferring data (380). Data are moved between the DIMM and another device or component on the system in portions which may be four, eight, sixteen, or another number of bytes in size, as supported by the hardware, as shown by the looping notation at block 380. When all the data have been transferred, the DMA engine may check for another request that requires access to the same DIMM (385). If there is such a request, it can be accepted and started immediately. Otherwise, the DMA engine may return the just-accessed DIMM to "sleep" mode (390) and resume waiting for a DMA request on a DIMM that is ready.

Figure 3:
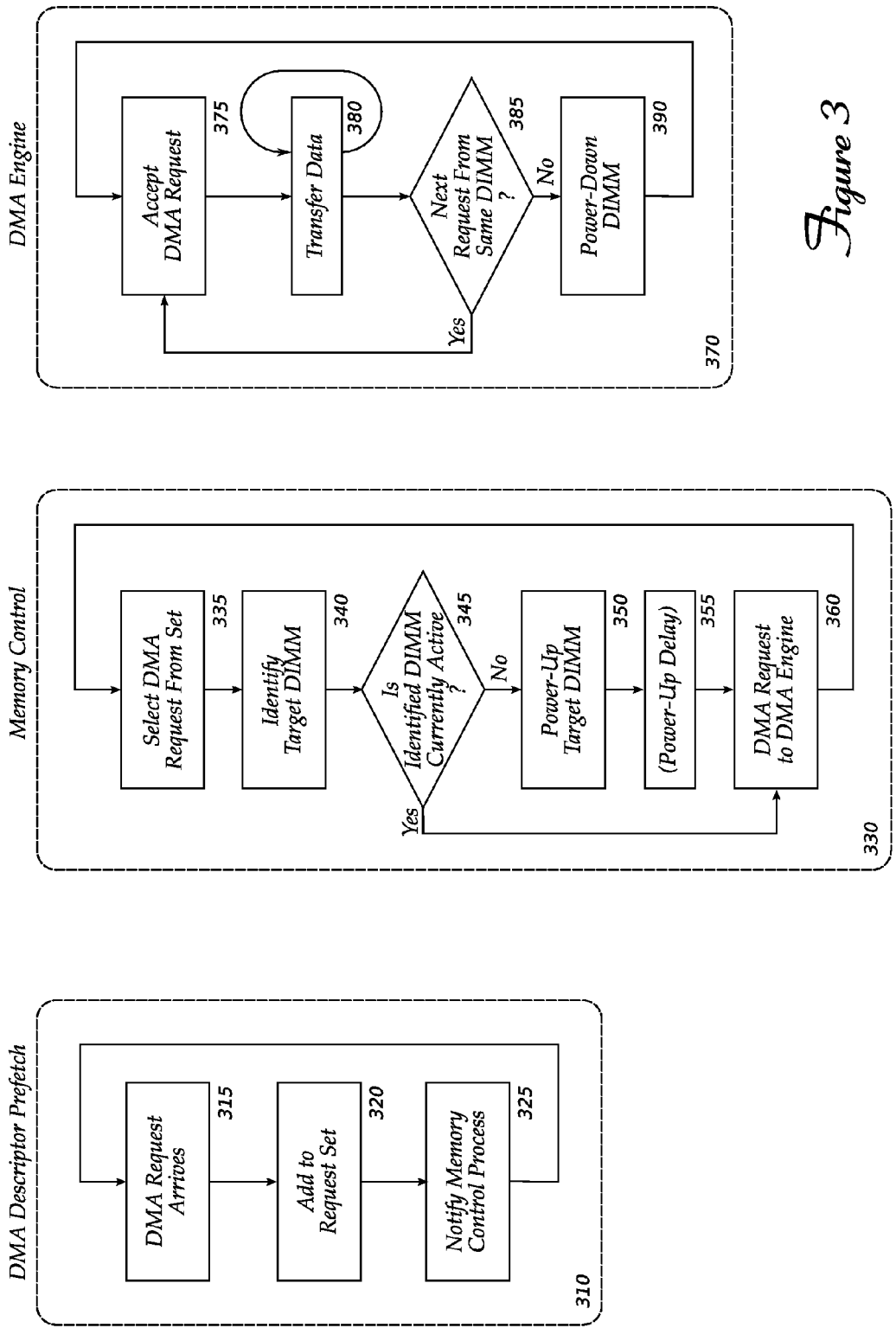
FIG. 3 is a flow chart showing the steps and decisions involved in an embodiment of the invention.
Figure 4:
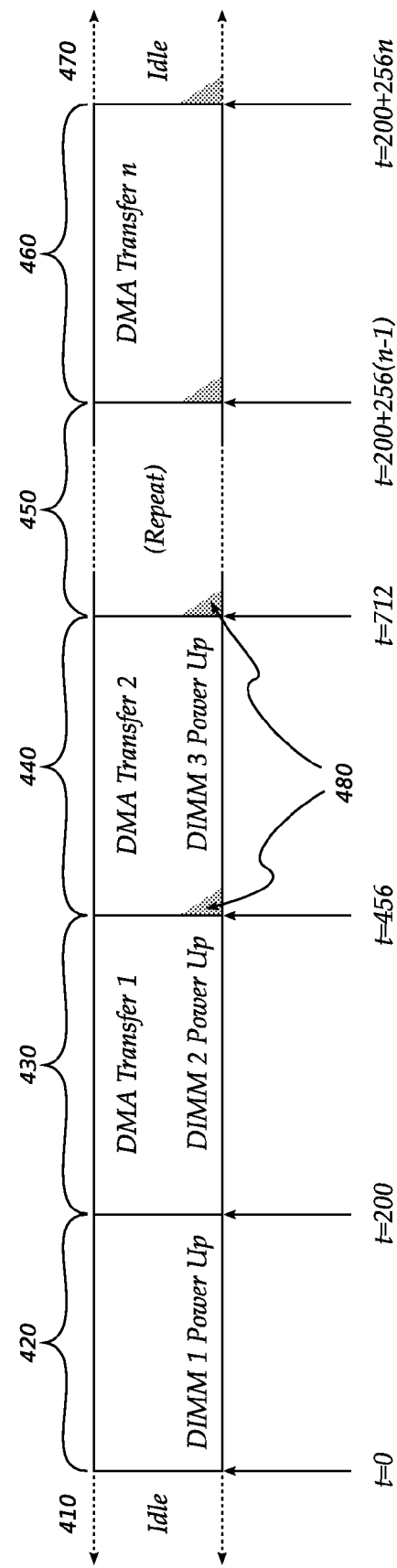
FIG. 4 is a timeline showing how proper coordination of events occurring within a memory bank can reduce the impact of long delays in memory access.

FIG. 4 shows the temporal relationship between the steps and decisions described with reference to FIG. 3, and illustrates how most memory "wake" delays can be overlapped with other processing to avoid impacting overall system performance.

In period 410, before t=0, the memory is idle and all the DIMMs are in a low-power state. At t=0, a first DMA request is scheduled. The circuitry determines which DIMM contains the source or destination memory addresses (the "target addresses"), and begins the power-up sequence of that DIMM. Other DMA requests may be scheduled during time period 420 (or, indeed, at any other time shown in the timeline). At t=200, DIMM 1 becomes operational and the first DMA transfer occurs during time period 430. In addition, the circuitry selects another DMA request that may have been scheduled, determines which DIMM contains the source or destination memory address, and begins the power-up sequence of that DIMM ("DIMM 2"). If the first DMA operation takes, for example, 256 clock cycles, then at t=456, the first DMA will complete. Since the power-up procedure of DIMM 2 takes only 200 cycles, the second DMA operation can be started immediately after the first DMA operation completes. The second DMA occurs during time period 440, and the circuitry may select another DMA request, determine which DIMM contains the source or destination memory address, and begin the power-up sequence of that DIMM ("DIMM 3"). Note that after a DMA transfer has moved data to or from a DIMM, that DIMM can be returned to low-power mode. The process of shutting down a DIMM takes only a few clock cycles, and is indicated by gray triangles 480 in the timeline.

The process of selecting a DMA request, powering up the affected DIMM, performing the DMA transfer, and powering down the DIMM can be repeated indefinitely during time period 450. Eventually, the last scheduled DMA operation may be completed (time period 460), and the memory module returns to idle mode during time period 470.

The process described permits the memory to be operated at only a fraction of the full power required by all the DIMMs in normal operating state because at any time, one DIMM is operating, one DIMM is transitioning to its normal power state, and one DIMM is (rapidly) switching from normal power state to low-power state. The remaining DIMMs are in low-power state. Furthermore, in this example, each DMA transfer takes longer than the power-up time of the next DIMM, so the power-up latency time can be completely hidden and does not affect the overall system latency or response time. The only exception is the first power-up cycle, time period 320, when the memory bank begins operating again after an idle period. However, in a busy system, such idle periods should be rare; conversely, if a system is so underutilized that idle periods are common, then any delay a client perceives due to a DIMM's power-up cycle may be shorter than the delay it might perceive due to a heavier load on the storage server.

Furthermore, as discussed previously, it may be possible to operate a DIMM that has just been brought out of low-power mode within only a few clock cycles (bypassing the time-consuming DLL synchronization process) by using slower, unsynchronized memory cycles. If, for example, the unsynchronized memory cycle takes twice as long as a synchronized cycle, then DMA transfers that would take fewer than 200 cycles at full speed can be completed faster by performing unsynchronized, half-speed accesses (requiring less than 400 cycles) than by spending 200 cycles synchronizing the DIMM clocks and performing the accesses at full speed. Some memory access patterns may make this option more attractive than suffering the power-up delay penalty at the beginning of a sequence of memory operations after an idle period. Note that even if the first access after an idle period is performed at the slower, unsynchronized speed, the second and subsequent accesses can be performed at full speed because the synchronization periods of those target DIMMs can be overlapped with the first memory operation or the previous memory operation.

Figure 5:
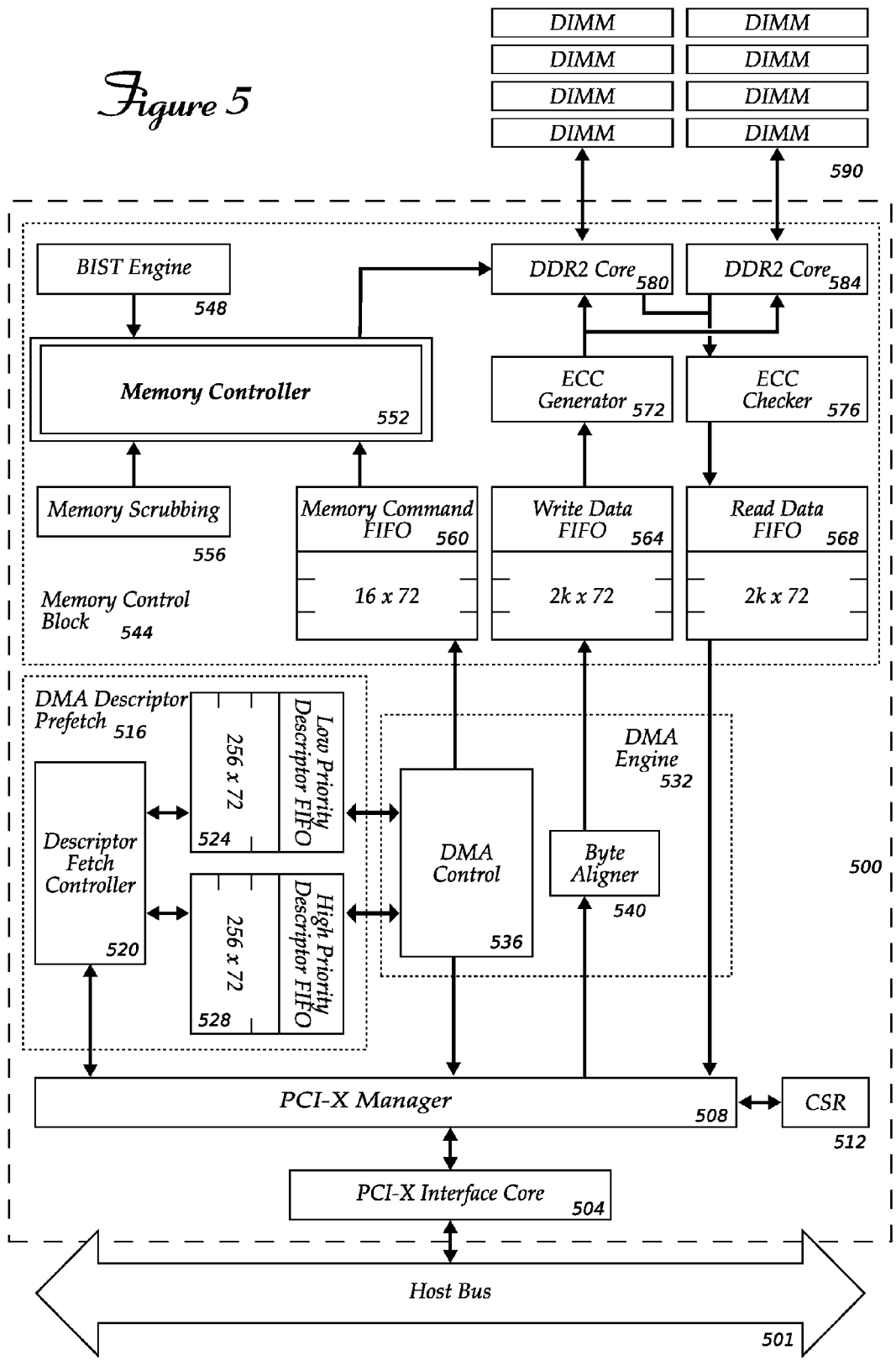
FIG. 5 shows the functional blocks that may be contained in a hardware embodiment of the invention.

FIG. 5 shows a block diagram of the structural components that may be present in a computer memory system such as a portion of main memory 220 in FIG. 2 or an add-in memory card such as PCI cache memory 250 in FIG. 2, which includes an embodiment of the invention. The cache control functions represented within dashed line 500 may be implemented by one or more integrated circuits, programmable gate arrays, or other circuit elements. Host bus 501 represents a communication channel that permits the cache controller to transfer data between DIMM banks 590 and other components in the system (not shown in this figure). Peripheral Component Interface-Extended ("PCI-X") Interface Core 504, PCI-X Manager 508 and Command-Status Register 512 provide electrical and timing control appropriate for interfacing to host bus 501. The DMA Descriptor Prefetch section 516, including descriptor fetch controller 520, low-priority descriptor first-in, first-out ("FIFO") 524 and high-priority descriptor FIFO 528, receives DMA requests from the system and provides them to DMA engine 532. The DMA engine 532, including DMA control 536 and byte aligner 540, moves data between the host system and memory control block 544. The source (or destination) on the host system may be, for example, memory 220 as shown in FIG. 2, or some other device or component that can be accessed through host bus 501.

Memory control block, including built-in self test ("BIST") engine 548, memory controller 552, scrubber 556, command and data FIFOs 560, 564 and 568, error correction code ("ECC") generator 572 and ECC checker 576, and DDR2 cores 580 and 584, moves data in or out of DIMMs 590, and performs the power coordination functions of embodiments of the invention. For example, memory controller 552 may provide appropriate signals to bring a DIMM that is the source or target of a DMA operation out of low-power mode, and may provide other signals to place a DIMM that has completed a DMA operation back into low-power mode.

The cache controller 500 shown in FIG. 5 is a programmable memory controller that accesses memory based on DMA descriptors it receives from the host system. It manages the power supplied to DIMMs 590 according to an embodiment of the invention, so that the DIMMs use less power than they would if each DIMM was in fully operational status at all times. This management is essential in a system where the overall power consumption is limited to a maximum value. For example, the maximum allowed power consumption of a PCI card is 25 W. Using the example power consumption for the 2G DIMM mentioned above, one might calculate that a PCI cache memory card could normally hold no more than 20 GB (9 DIMMs in "ready" mode at 2.26 W and 1 DIMM operating at 3.08 W, with 1.58 W excess for miscellaneous control functions). However, if the DIMMs on the PCI card were operated according to an embodiment of the invention, then by a similar calculation the card could contain 116 GB: 56 DIMMs in self-refresh mode at 324 mW, 1 DIMM powering up at 2.26 W and 1 DIMM operating at 3.08 W, with 1.52 W for miscellaneous and control functions.

In the application described above, several assumptions are made. First, the time to activate a DIMM from low-power mode is assumed to be 200 clock cycles. Second, the time to complete a DMA transfer is assumed to be 256 cycles. Third, although it is not specifically discussed, it is assumed that the time required to perform calculations such as determining which DIMM a DMA transfer targets, and the time required to issue power-down and power-up commands, is less than 56 cycles. These assumptions will be examined below.

The power-up latency depends upon the specific memory module in use, and may be greater or less than 200 clock cycles. In subsequent paragraphs, the latency will simply be called $T_{power-up}$. Likewise, the time to switch a memory from operational mode to low-power mode will be called $T_{power-down}$.

The assumption that DMA transfers require 256 cycles comes from the premise that such transfers will move 4K blocks over a 64-bit-wide bus, moving 16 bytes (128 bits) each clock cycle. Naturally, transfers of smaller blocks or transfers over a wider bus can be completed in less time. Although DMA operations are a clear case where memory access patterns are predictable, other applications might exhibit similarly coherent locality of reference. For example, a video display driver might require access to known blocks of display memory, or a 3-D rendering engine might operate on vertex or shading data stored in contiguous memory locations. The time required to perform the DMA operation or to access the memory in a DIMM for other purposes will be called $T_{access}$.

The "administrative" overhead required to identify the DIMM among a number of DIMMs that contains the source or target of a DMA transfer can reasonably be assumed to be small, as it typically involves only examining a subset of the bits of the DMA source and destination addresses. Administrative tasks also include such operations as selecting a next memory access request to perform from among the set of access requests issued. The access requests may be stored by a scheme as simple as a first-in, first-out (FIFO) queue. However, even complex queuing schemes can usually be performed within only a few tens of cycles, and in any case these calculations can be performed while the next DIMM is powering up. Administrative time will be called $T_{admin}$.

Embodiments of the present invention can hide power-management delays when performing a sequence of work as long as $T_{access} \leq T_{admin} + T_{power-up} + T_{power-down}$. In addition, even if a single access operation does not last long enough to completely overlap the administrative, power-up, and power-down times, an embodiment of the invention may sort access requests according to an algorithm such as the known elevator algorithm, so that several access operations can be performed on one DIMM while the next DIMM is powering up. In this embodiment, a request would be selected not based upon an order in which it was received, but based upon the DIMM to or from which data were to be transferred. Thus, multiple requests to access the same DIMM would be processed together. Finally, even if it is not always possible to hide all power-management delays, embodiments of the invention may permit the use of more memory than would otherwise be possible under a set of power constraints, so that the overall application benefit exceeds the cost of unhidden delays.

Some embodiments of the invention may perform special processing to select the first DMA operation to perform after an idle period, to take advantage of a DIMM's ability to operate in an unsynchronized mode. As discussed earlier, if a block of memory can be transferred at low speed faster than it can be transferred at high speed (after taking into account $T_{power-up}$), then it may be preferable to perform the first operation at low speed. An embodiment of the invention may select such a DMA operation as the first one to perform after an idle period. After this first operation, the memory controller can continue as described above.

Embodiments of the present invention have been described largely by reference to specific examples and in terms of particular allocations of functionality to certain hardware and/or software components. However, those of skill in the art will recognize that the methods can also be performed by software and hardware that distribute the functions of embodiments of this invention differently than herein described. Such variations and implementations are understood to be apprehended according to the following claims. It should be noted that references to "an" or "one" embodiment in this disclosure are not necessarily to the same embodiment, and such references mean "at least one."

We claim:

1. A method comprising:
providing power to a plurality of memory modules, each module having at least a low power state and a normal power state;

maintaining a set of memory access requests, each request to be satisfied by at least one of one of the plurality of memory modules;

selecting a first memory access request from the set of memory access requests;

changing a state of a first one of the plurality of memory modules from a low power state to a normal power state;

executing the first memory access request;

changing a state of the first one of the plurality of memory modules from a normal power state to a low power state after executing the first memory access request;

while the first memory access request is executing, selecting a second memory access request from the set of memory access requests;

changing a state of a second one of the plurality of memory modules from a low power state to a normal power state; and executing the second memory access request.

2. The method of claim 1, further comprising:

choosing the first one of the plurality of memory modules based on an address in the first memory access request; wherein the choosing operation precedes the changing operation.

3. The method of claim 1 wherein at least one of the plurality of memory modules is in the low power state while the first memory access request is being executed.

4. The method of claim 1, wherein selecting a second memory access request is selecting the second memory access request according to an elevator algorithm.

5. The method of claim 1, wherein the set of memory access requests is a set of DMA requests.

6. The method of claim 1, wherein selecting a first memory access request is selecting the first memory access request from a first-in, first-out (FIFO) data structure.

7. An apparatus comprising:

a plurality of memory modules, each module having at least a power saving state and a normal state; and a memory controller to process a set of memory access requests by selecting a first memory access request from the set;

changing a state of one of the plurality of memory modules from a power saving state to a normal state;

executing the first memory access request; and changing a state of the one of the plurality of memory modules from a normal state to a power saving state;

wherein at all times:

no more than one memory module is in the normal state;

no more than one memory module is transitioning from the power saving state to the normal state; and no more than one memory module is transitioning from the normal state to the power saving state.

8. The apparatus of claim 7 wherein the memory controller changes a state of one of the plurality of memory modules based on an address in the first memory access request.

9. The apparatus of claim 7 wherein each memory module has a first power consumption in the power saving state and a second power consumption in the normal state;

the sum of the first power consumption for each memory module is less than a maximum power consumption for the apparatus; and the sum of the second power consumption for each memory module is greater than a maximum power consumption for the apparatus.

10. The apparatus of claim 7, further comprising:

a computer system including a system memory, a mass storage device, and a communication facility, the computer system to provide data storage services to a client; wherein cache victim data are transferred from the system memory to the one of the plurality of memory modules.

11. A method comprising:

individually controlling an operational state of each of a plurality of memory modules, wherein each of the memory modules has a low-power idle state and a normal-power operational state;

transferring data from a first of the plurality of memory modules in a first transferring operation, said operation to occur while the first memory module is in the normal-power state;

transitioning a second of the plurality of memory modules from the low-power state to the normal-power state while the first transferring operation is in progress;

transferring data from the second memory module after the second memory module reaches the normal-power state; and transitioning the first memory module to the low-power state after the first transferring operation completes.

* * * * *